(12) United States Patent
Zhang et al.

(10) Patent No.: US 10,777,683 B2
(45) Date of Patent: Sep. 15, 2020

(54) THIN FILM TRANSISTOR, METHOD OF MANUFACTURING THIN FILM TRANSISTOR, ARRAY SUBSTRATE AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Yang Zhang, Beijing (CN); Luke Ding, Beijing (CN); Bin Zhou, Beijing (CN); Haitao Wang, Beijing (CN); Ning Liu, Beijing (CN); Jingang Fang, Beijing (CN); Yongchao Huang, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/403,860

(22) Filed: May 6, 2019

(65) Prior Publication Data
US 2020/0075773 A1    Mar. 5, 2020

(30) Foreign Application Priority Data

Aug. 28, 2018 (CN) .......................... 2018 1 0988346

(51) Int. Cl.
*H01L 29/786* (2006.01)
*H01L 27/12* (2006.01)
(Continued)

(52) U.S. Cl.
CPC ...... *H01L 29/78633* (2013.01); *H01L 27/127* (2013.01); *H01L 27/1225* (2013.01);
(Continued)

(58) Field of Classification Search
CPC ......... H01L 29/78633; H01L 29/66969; H01L 29/7869; H01L 27/1225; H01L 27/127;
(Continued)

(56) References Cited

U.S. PATENT DOCUMENTS 6,232,158 B1 * 5/2001 Lee .................... H01L 29/41733
257/E21.414
9,748,280 B2   8/2017 Long et al.
(Continued)

FOREIGN PATENT DOCUMENTS

CN          104282769 A       1/2015

*Primary Examiner* — Tong-Ho Kim
(74) *Attorney, Agent, or Firm* — Westman, Champlin & Koehler, P.A.

(57) ABSTRACT

A thin film transistor, a method of manufacturing the same, an array substrate and a display panel are disclosed. The thin film transistor includes a light blocking layer, an electrode layer, and a combination layer, which are sequentially stacked. The electrode layer includes a gate electrode, a source electrode and a drain electrode which are separated from one another, and the gate electrode is located between the source electrode and the drain electrode. The light blocking layer includes a first portion of which an orthogonal projection is located between an orthogonal projection of the gate electrode and an orthogonal projection of the source electrode; and a second portion of which an orthogonal projection is located between the orthogonal projection of the gate and an orthogonal projection of the drain. The combination layer includes an active layer.

17 Claims, 7 Drawing Sheets

(51) Int. Cl.
*H01L 29/66* (2006.01)
*H01L 27/32* (2006.01)

(52) U.S. Cl.
CPC .... *H01L 27/1288* (2013.01); *H01L 29/66969* (2013.01); *H01L 29/7869* (2013.01); *H01L 27/3262* (2013.01); *H01L 27/3272* (2013.01)

(58) Field of Classification Search
CPC ............. H01L 27/1288; H01L 27/3262; H01L 27/3272
USPC .......................................................... 257/43
See application file for complete search history.

(56) References Cited

U.S. PATENT DOCUMENTS

2016/0172590 A1* 6/2016 Xie ...................... H01L 51/002
  257/40
2016/0254285 A1  9/2016 Long et al.
2016/0307986 A1* 10/2016 Gai ......................... H01L 21/77

* cited by examiner

THIN FILM TRANSISTOR, METHOD OF MANUFACTURING THIN FILM TRANSISTOR, ARRAY SUBSTRATE AND DISPLAY PANEL

CROSS-REFERENCE TO RELATED APPLICATION

This application claims the benefit of Chinese Patent Application No. 201810988346.5, filed with the State Intellectual Property Office of China on Aug. 28, 2018, the whole disclosure of which is incorporated herein by reference.

TECHNICAL FIELD

Embodiments of the present disclosure relate to a thin film transistor, a method of manufacturing the thin film transistor, an array substrate and a display panel.

BACKGROUND

An array substrate of an organic light-emitting diode display panel includes organic light emitting units arranged in a matrix. Each of the organic light emitting units includes an organic light-emitting diode and a thin film transistor.

FIG. 1 is a schematic sectional view showing a structure of a conventional array substrate. As shown in FIG. 1, the array substrate includes: a base substrate 1, and a thin film transistor formed on the base substrate 1. The thin film transistor includes:

a gate electrode 2, a gate insulating layer 3, an active layer 4, an interlayer insulating layer 5, a source electrode 6 and a drain electrode 7, which are sequentially formed on the base substrate 1. Via holes are formed in the interlayer insulating layer 5. As shown in FIG. 1, the via holes are filled with a portion of a conductive layer of the same material as the source electrode and the drain electrode, and the source electrode 6 and the drain electrode 7 are electrically connected to the active layer 4 through the via holes, respectively.

SUMMARY

Embodiments of the present disclosure provide a thin film transistor comprising: a light blocking layer, an electrode layer, and a combination layer, which are sequentially stacked in a stacking direction; wherein the electrode layer comprises a gate electrode, a source electrode and a drain electrode which are separated from one another, and the gate electrode is located between the source electrode and the drain electrode, wherein the light blocking layer comprises: a first portion of which an orthogonal projection in the stacking direction is located between an orthogonal projection of the gate electrode in the stacking direction and an orthogonal projection of the source electrode in the stacking direction; and a second portion of which an orthogonal projection in the stacking direction is located between the orthogonal projection of the gate in the stacking direction and an orthogonal projection of the drain in the stacking direction; and wherein the combination layer comprises an active layer.

According to embodiments of the present disclosure, an orthogonal projection of the active layer in the stacking direction is in a range of the orthogonal projection of the gate electrode in the stacking direction.

According to embodiments of the present disclosure, the thin film transistor further comprises: an insulating layer having a portion located between the electrode layer and the combination layer, wherein the combination layer further comprises a first conductor layer and a second conductor layer respectively located on both sides of the active layer, the first conductor layer is electrically connected to the source electrode through a first via hole passing through the insulating layer, and the second conductor layer is electrically connected to the drain electrode through a second via hole passing through the insulating layer.

According to embodiments of the present disclosure, the electrode layer comprises a first metal layer.

According to embodiments of the present disclosure, the thin film transistor further comprises: a second metal layer located in a same layer as the light blocking layer, wherein the second metal layer comprises a first portion, a second portion and a third portion respectively located under the gate electrode, the source electrode and the drain electrode, wherein the light blocking layer adjoins to the second metal layer, and a material of which the light blocking layer is made is an oxide of which a metal material of the second metal layer is made.

According to embodiments of the present disclosure, a material of which the active layer is made is a metal oxide semiconductor material, and the first conductor layer and the second conductor layer are formed by conductorizing the metal oxide semiconductor material.

According to embodiments of the present disclosure, the orthogonal projections of the gate electrode, the source electrode and the drain electrode in the stacking direction coincide with orthogonal projections of the first portion, the second portion and the third portion of the second metal layer in the stacking direction, respectively.

Embodiments of the present disclosure further provide an array substrate comprising: a base substrate; and the above thin film transistor formed on the base substrate.

Embodiments of the present disclosure further provide a display panel comprising the above array substrate assembly.

Embodiments of the present disclosure further provide a method of manufacturing a thin film transistor, the method comprising: sequentially forming a light blocking layer, an electrode layer, and a combination layer in a stacking direction; wherein the electrode layer comprises a gate electrode, a source electrode and a drain electrode which are separated from one another, and the gate electrode is located between the source electrode and the drain electrode, wherein the light blocking layer comprises: a first portion of which an orthogonal projection in the stacking direction is located between an orthogonal projection of the gate electrode in the stacking direction and an orthogonal projection of the source electrode in the stacking direction; and a second portion of which an orthogonal projection in the stacking direction is located between the orthogonal projection of the gate electrode in the stacking direction and an orthogonal projection of the drain electrode in the stacking direction; and wherein the combination layer comprises an active layer.

According to embodiments of the present disclosure, an orthogonal projection of the active layer in the stacking direction is in a range of the orthogonal projection of the gate electrode in the stacking direction.

According to embodiments of the present disclosure, the method further comprises: forming an insulating layer subsequent to forming the electrode layer and prior to forming the combination layer, wherein the combination layer further comprises a first conductor layer and a second conductor layer respectively located on both sides of the active layer, the first conductor layer is electrically connected to the source electrode through a first via hole passing through the insulating layer, and the second conductor layer is electrically connected to the drain electrode through a second via hole passing through the insulating layer.

According to embodiments of the present disclosure, the electrode layer comprises a first metal layer.

According to embodiments of the present disclosure, the method further comprises: forming a second metal layer located in a same layer as the light blocking layer, wherein the second metal layer comprises a first portion, a second portion and a third portion respectively located under the gate electrode, the source electrode and the drain electrode, wherein the light blocking layer adjoins to the second metal layer, and a material of which the light blocking layer is made is an oxide of a metal material of which the second metal layer is made.

According to embodiments of the present disclosure, the step of sequentially forming the light blocking layer, the electrode layer, and the combination layer; the step of forming the insulating layer; and the step of forming the second metal layer, comprise: sequentially forming a second metal material layer and a first metal material layer; processing the second metal material layer and the first metal material layer to form the second metal layer and the light blocking layer, and the gate electrode, the source electrode and the drain electrode that are separated from one another and located over the second metal layer, respectively; forming the insulating layer on the light blocking layer, the gate electrode, the source electrode and the drain electrode, and forming, in the insulating layer, the first via hole and the second via hole which pass through the insulating layer and are located respectively over the source electrode and the drain electrode; forming a metal oxide semiconductor material layer on the insulating layer while filling the first via hole and the second via hole with a portion of the metal oxide semiconductor material layer; and processing the metal oxide semiconductor material layer to form the first conductor layer, the second conductor layer and the active layer while the portion of the metal oxide semiconductor material layer in the first via hole and the second via hole is conductorized.

According to embodiments of the present disclosure, processing the second metal material layer and the first metal material layer to form the second metal layer and the light blocking layer, and the gate electrode, the source electrode and the drain electrode that are separated from one another and located over the second metal layer, respectively comprises: forming a first photoresist on the first metal material layer; patterning the first photoresist by means of a half-tone mask process or a gray-tone mask process to form a photoresist-completely-retained region corresponding to a segment of the first metal material layer for forming the gate electrode, the source electrode and the drain electrode, a photoresist-partially-retained region corresponding to a segment of the second metal material layer for forming the light blocking layer, and a photoresist-removed region corresponding to other segments of the first metal material layer and the second metal material layer; etching away the other segments of the first metal material layer and the second metal material layer corresponding to the photoresist-removed region; removing a segment of the first photoresist in the photoresist-partially-retained region, and a portion of a thickness of a segment of the first photoresist in the photoresist-completely-retained region; etching away a segment of the first metal material layer corresponding to the photoresist-partially-retained region; and oxidizing the exposed segment of the second metal material layer corresponding to the photoresist-partially-retained region to form the light blocking layer, wherein a segment of the second metal material layer corresponding to the photoresist-completely-retained region forms the second metal layer.

According to embodiments of the present disclosure, processing the second metal material layer and the first metal material layer to form the second metal layer and the light blocking layer, and the gate electrode, the source electrode and the drain electrode that are separated from one another and located over the second metal layer, respectively further comprises: removing the residual segment of the first photoresist in the photoresist-completely-retained region, wherein a segment of the first metal material layer corresponding to the photoresist-completely-retained region forms the gate electrode, the source electrode and the drain electrode.

According to embodiments of the present disclosure, processing the metal oxide semiconductor material layer comprising: forming a second photoresist on the metal oxide semiconductor material layer; patterning the second photoresist by means of a half-tone mask process or a gray-tone mask process to form a photoresist-completely-retained region corresponding to a segment of the metal oxide semiconductor material layer for forming the active layer, a photoresist-partially-retained region corresponding to a segment of the metal oxide semiconductor material layer for forming the first conductor layer and the second conductor layer, and a photoresist-removed region corresponding to a to-be-removed segment of the metal oxide semiconductor material layer, wherein the first via hole is located in a region of the first conductor layer and the second via hole is located in a region of the second conductor layer; etching away the to-be-removed segment of the metal oxide semiconductor material layer corresponding to the photoresist-removed region;

removing a segment of the second photoresist in the photoresist-partially-retained region, and a portion of a thickness of a segment of the second photoresist in the photoresist-completely-retained region; and metalizing the segment of the metal oxide semiconductor material layer corresponding to the photoresist-partially-retained region so that the segment of the metal oxide semiconductor material layer corresponding to the photoresist-partially-retained region is conductorized to form the first conductor layer and the second conductor layer, while the portion of the metal oxide semiconductor material layer in the first via hole and the second via hole is conductorized.

According to embodiments of the present disclosure, processing the metal oxide semiconductor material layer further comprising: removing the residual segment of the second photoresist in the photoresist-completely-retained region, wherein a segment of the metal oxide semiconductor material layer corresponding to the photoresist-completely-retained region forms the active layer.

According to embodiments of the present disclosure, a material of which the active layer is made is a metal oxide semiconductor material, and the first conductor layer and the second conductor layer are formed by conductorizing the metal oxide semiconductor material.

It should be understood that the foregoing general description and the following detailed description are merely exemplary and explanatory and are not intended to limit the present disclosure.

BRIEF DESCRIPTION OF THE DRAWINGS

The drawings described herein are used to provide further understanding of the present disclosure and constitute a part of the present disclosure. The present disclosure are explained by means of the drawings together with the following embodiments but should not be construed as being limited to the drawings and the embodiments.

DETAILED DESCRIPTION

A clear and complete description of technical solutions in embodiments of the present disclosure will be made as below in conjunction with the accompanying drawings in the embodiments of the present disclosure. Apparently, the described embodiments are some of the embodiments of the present disclosure rather than all of the embodiments of the present disclosure. All other embodiments derived by those skilled in the art based on the embodiments of the present disclosure without making a creative work shall fall within the protection scope of the present disclosure.

Figure 2:
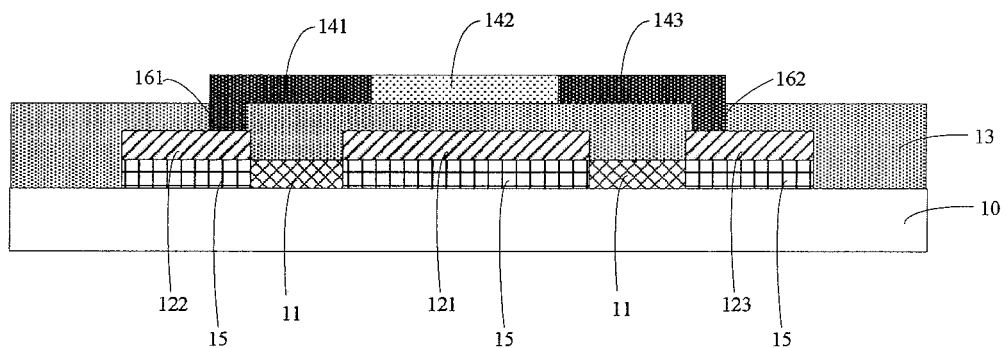
FIG. 2 is a schematic sectional view showing a structure of a thin film transistor formed on a base substrate according to an embodiment of the present disclosure.

Embodiments of the present disclosure provide a thin film transistor. Referring to FIG. 2, the thin film transistor includes: a light blocking layer 11, an electrode layer, and a combination layer, which are sequentially stacked in a stacking direction. The electrode layer includes a gate electrode 121, a source electrode 122 and a drain electrode 123 which are separated from one another, and the gate electrode 121 is located between the source electrode 122 and the drain electrode 123. The light blocking layer 11 includes: a first portion of which an orthogonal projection in the stacking direction or on a base substrate 10 is located between an orthogonal projection of the gate electrode 121 in the stacking direction or on the base substrate 10 and an orthogonal projection of the source electrode 122 in the stacking direction or on the base substrate 10; and a second portion of which an orthogonal projection in the stacking direction or on the base substrate 10 is located between the orthogonal projection of the gate electrode 121 in the stacking direction or on the base substrate 10 and an orthogonal projection of the drain electrode 123 in the stacking direction or on the base substrate 10. The combination layer includes an active layer 142.

According to embodiments of the present disclosure, referring to FIG. 2, an orthogonal projection of the active layer 142 in the stacking direction or on the base substrate 10 is in a range of the orthogonal projection of the gate electrode 121 in the stacking direction or on the base substrate 10.

According to embodiments of the present disclosure, referring to FIG. 2, the thin film transistor further includes: an insulating layer 13 having a portion located between the electrode layer and the combination layer. The combination layer further includes a first conductor layer 141 and a second conductor layer 143 respectively located on both sides of the active layer 142, the first conductor layer 141 is electrically connected to the source electrode 122 through a first via hole 161 passing through the insulating layer 13, and the second conductor layer 143 is electrically connected to the drain electrode 123 through a second via hole 162 passing through the insulating layer 13.

According to embodiments of the present disclosure, the electrode layer is a first metal layer.

According to embodiments of the present disclosure, referring to FIG. 2, the thin film transistor further includes: a second metal layer 15 located in a same layer as the light blocking layer 11. The second metal layer 15 includes a first portion, a second portion and a third portion respectively located under the gate electrode 121, the source electrode 122 and the drain electrode 123. The light blocking layer 11 adjoins to the second metal layer 15, and a material of which the light blocking layer 11 is made is an oxide of a metal material of which the second metal layer 15 is made. For example, referring to FIG. 2, the orthogonal projections of the gate electrode 121, the source electrode 122 and the drain electrode 123 in the stacking direction or on the base substrate 10 coincide with orthogonal projections of the first portion, the second portion and the third portion of the second metal layer 15 in the stacking direction or on the base substrate 10, respectively.

An example of the embodiments of the present disclosure provides a thin film transistor. As shown in FIG. 2, the thin film transistor includes: a light blocking layer 11, a first metal layer, an insulating layer 13 and a combination layer, which are sequentially stacked. The first metal layer includes a gate electrode 121, a source electrode 122 and a drain electrode 123 which are separated from one another, and the gate electrode 121 is located between the source electrode 122 and the drain electrode 123. The light blocking layer 11 includes a portion located between the gate electrode 121 and the source electrode 122, and a portion located between the gate electrode 121 and the drain electrode 123. The combination layer includes a first conductor layer 141, a second conductor layer 143 and an active layer 142. An orthogonal projection of the active layer 142 in a thickness direction thereof is in a range of the orthogonal projection of the gate electrode 121 in a thickness direction thereof. The first conductor layer 141 and the second conductor layer 143 are located on both sides of the active layer 142, respectively. The first conductor layer 141 is electrically connected to the source electrode 122 through a first via hole 161 passing through the insulating layer 13, and the second conductor layer 143 is electrically connected to the drain electrode 123 through a second via hole 162 passing through the insulating layer 13.

The thin film transistor (TFT) may be formed on the base substrate 10. The gate electrode 121, the source electrode 122 and the drain electrode 123 are located in a same layer. Since the gate electrode 121, the source electrode 122 and the drain electrode 123 are separated from one another, they are insulated from one another. The gate electrode 121, the source electrode 122 and the drain electrode 123 may be made of a same metal material by a single patterning process.

In the embodiments of the present disclosure, referring to FIG. 2, the first conductor layer 141 and the second conductor layer 143 are located in a same layer as the active layer 142. The first conductor layer 141 and the second conductor layer 143 are located on both sides of the active layer 142, respectively, and are in contact with and electrically connected to the active layer 142, respectively. Further, the first conductor layer 141 is electrically connected to the source electrode 122 through the first via hole 161, and the second conductor layer 143 is electrically connected to the drain electrode 123 through the second via hole 162. Thereby, the source electrode 122 and the drain electrode 123 are electrically connected to the active layer 142 through the first conductor layer 141 and the second conductor layer 143, respectively. When the thin film transistor is turned on or conducts by applying a voltage to the gate electrode 121, carriers are generated in the active layer 142, so that a current may be generated between the source electrode 122 and the drain electrode 123.

In the present embodiment, as shown in FIG. 2, the active layer 142 is disposed over a region where the gate electrode 121 is located, the light blocking layer 11 is formed in both a region between the gate electrode 121 and the source electrode 122, and a region between the gate electrode 121 and the drain electrode 123, and the light blocking layer 11 is formed on both sides of a region located under the gate electrode 121. In other words, when viewed in a direction perpendicular to the active layer 142 or the light blocking layer 11, the light blocking layer 11 is located on both sides of the active layer 142. The orthogonal projection of the active layer 142 in the thickness direction thereof is in the range of the orthogonal projection of the gate electrode 121 in the thickness direction thereof. In other words, a width of the active layer 142 is less than or equal to a width of the gate electrode 121. A material of the gate electrode 121 is a metal material which blocks a light. Therefore, the gate electrode 121 can avoid an incidence of a light on the active layer 142 from under the active layer 142, and the light blocking layer 11 located on both sides of the active layer 142 when viewed in the direction perpendicular to the active layer 142 or the light blocking layer 11 can avoid an incidence of a light on the active layer 142 from both sides of the active layer 142, thereby avoiding an adverse influence of a light irradiation on the thin film transistor and thus improving an operational stability of the thin film transistor.

In some examples, as shown in FIG. 2, the thin film transistor further includes: a second metal layer 15 located in a same layer as the light blocking layer 11. The second metal layer 15 includes portions respectively located under the gate electrode 121, the source electrode 122 and the drain electrode 123. The light blocking layer 11 adjoins to the second metal layer 15, and a material of which the light blocking layer 11 is made is an oxide of a metal material of which the second metal layer 15 is made.

In the present embodiment, the portions of the second metal layer 15 adjoin to the light blocking layer 11 and are located in the same layer as the light blocking layer 11. The second metal layer 15 and the light blocking layer 11 may be an integrated film. The second metal layer 15 is a conductive layer, the light blocking layer 11 is a layer of a metal oxide formed by oxidizing a metal and thus is an insulating layer, and the light blocking layer 11 includes a portion located between the gate electrode 121 and the source electrode 122, and a portion located between the gate electrode 121 and the drain electrode 123. Therefore, the gate electrode 121, the source electrode 122 and the drain electrode 123 can be insulated from one another by the portions of the light blocking layer 123, although the gate electrode 121, the source electrode 122 and the drain electrode 123 may be electrically connected to the portions of the second metal layer 15 correspondingly under the gate electrode 121, the source electrode 122 and the drain electrode 123.

When the light blocking layer 11 and the second metal layer 15 are formed, a second metal material layer is first formed, and then a segment of the second metal material layer for forming the light blocking layer 11 is oxidized to form the light blocking layer 11, and an inoxidized segment of the second metal material layer forms the second metal layer 15, thereby simplifying a process of manufacturing the thin film transistor and reducing a cost.

In some examples, as shown in FIG. 2, a material of which the active layer 142 is made is a metal oxide semiconductor material, and the first conductor layer 141 and the second conductor layer 143 are formed by conductorizing the metal oxide semiconductor material.

In the embodiments of the present disclosure, the metal oxide semiconductor material is, for example, indium gallium zinc oxide (IGZO), indium zinc oxide (IZO), or the like. The metal oxide semiconductor material has properties of a semiconductor and may be used as a material for manufacturing the active layer. The IGZO and IZO have a high carrier mobility, which advantageously increases a response speed of the thin film transistor and reduces a power consumption of the thin film transistor.

In the embodiments of the present disclosure, referring to FIG. 2, the first conductor layer 141, the second conductor layer 143, and the active layer 142 are located in a same layer. When the first conductor layer 141, the second conductor layer 143, and the active layer 142 are formed, a metal oxide semiconductor material layer is first formed, and then a segment of the metal oxide semiconductor material layer for forming the first conductor layer 141 and the second conductor layer 143 is conductorized to form the first conductor layer 141 and the second conductor layer 143, and an unconductorized segment of the metal oxide semiconductor material layer forms the active layer 142, thereby further simplifying the process of manufacturing the thin film transistor and further reducing the cost.

Embodiments of the present disclosure further provide an array substrate including: a base substrate; and the thin film transistor according to any one of the above embodiments, which is formed on the base substrate.

In embodiments of the present disclosure, the base substrate may be a rigid base substrate or a flexible base substrate. A material of which the rigid base substrate is made is, for example, glass, and a material of which the flexible base substrate is made is, for example, polyimide (PI), polycarbonate (PC), polyethylene terephthalate (PET), or the like. A flexible display panel can be manufactured by using the flexible base substrate.

The array substrate includes the thin film transistor according to the above embodiments. The thin film transistor has a high operational stability, and is especially suitable for use as an array substrate in an organic light-emitting diode (OLED) display panel.

In some embodiments, the array substrate may further include other films in addition to the thin film transistor. For example, as an array substrate applied in the liquid crystal display panel, the array substrate may be further formed with films such as a pixel electrode and a common electrode, and as an array substrate applied in the OLED display panel, the array substrate may be further formed with an OLED. The OLED includes, for example, an anode, an organic light-emitting layer, a cathode, and the like. In the present disclosure, the other films and structures of the array substrate are not limited.

Embodiments of the present disclosure further provide a method of manufacturing a thin film transistor. Referring to FIGS. 2, 3a-3m and 4, the method includes sequentially forming a light blocking layer 11, an electrode layer, and a combination layer in a stacking direction. The electrode layer includes a gate electrode 121, a source electrode 122 and a drain electrode 123 which are separated from one another, and the gate electrode 121 is located between the source electrode 122 and the drain electrode 123. The light blocking layer 11 includes: a first portion of which an orthogonal projection in the stacking direction or on a base substrate 10 is located between an orthogonal projection of the gate electrode 121 in the stacking direction or on the base substrate 10 and an orthogonal projection of the source electrode 122 in the stacking direction or on the base substrate 10; and a second portion of which an orthogonal projection in the stacking direction or on the base substrate 10 is located between the orthogonal projection of the gate electrode 121 in the stacking direction or on the base substrate 10 and an orthogonal projection of the drain electrode 123 in the stacking direction or on the base substrate 10. The combination layer includes an active layer 142.

Referring to FIGS. 2, 3a-3m and 4, according to embodiments of the present disclosure, an orthogonal projection of the active layer 142 in the stacking direction or on the base substrate 10 is in a range of the orthogonal projection of the gate electrode 121 in the stacking direction or on the base substrate 10.

Referring to FIGS. 2, 3a-3m and 4, according to embodiments of the present disclosure, the method further includes: forming an insulating layer 13 subsequent to forming the electrode layer and prior to forming the combination layer. The combination layer further includes a first conductor layer 141 and a second conductor layer 143 respectively located on both sides of the active layer 142, the first conductor layer 141 is electrically connected to the source electrode 122 through a first via hole 161 passing through the insulating layer 13, and the second conductor layer 143 is electrically connected to the drain electrode 123 through a second via hole 162 passing through the insulating layer 13.

According to embodiments of the present disclosure, the electrode layer is a first metal layer.

Referring to FIGS. 2, 3a-3m and 4, according to embodiments of the present disclosure, the method further includes: forming a second metal layer 15 located in a same layer as the light blocking layer 11. The second metal layer 15 includes a first portion, a second portion and a third portion respectively located under the gate electrode 121, the source electrode 122 and the drain electrode 123. The light blocking layer 11 adjoins to the second metal layer 15, and a material of which the light blocking layer 11 is made is an oxide of a metal material of which the second metal layer 15 is made.

An example of the embodiment of the present disclosure also provides a method of manufacturing a thin film transistor. Referring to FIGS. 2 and 3q, the method includes sequentially forming a light blocking layer 11, a first metal layer, an insulating layer 13 and a combination layer. The first metal layer includes a gate electrode 121, a source electrode 122 and a drain electrode 123 which are separated from one another, and the gate electrode 121 is located between the source electrode 122 and the drain electrode 123. The light blocking layer 11 includes a portion located between the gate electrode 121 and the source electrode 122, and a portion located between the gate electrode 121 and the drain electrode 123. The combination layer includes a first conductor layer 141, a second conductor layer 143 and an active layer 142. An orthogonal projection of the active layer 142 in a thickness direction thereof is in a range of the orthogonal projection of the gate electrode 121 in a thickness direction thereof. The first conductor layer 141 and the second conductor layer 143 are located on both sides of the active layer 142, respectively. The first conductor layer 141 is electrically connected to the source electrode 122 through a first via hole 161 passing through the insulating layer 13, and the second conductor layer 143 is electrically connected to the drain electrode 123 through a second via hole 162 passing through the insulating layer 13.

In some examples, referring to FIGS. 2 and 3q, the method may further include: forming a second metal layer 15 located in a same layer as the light blocking layer 11. The second metal layer 15 includes portions respectively located under the gate electrode 121, the source electrode 122 and the drain electrode 123. The light blocking layer 11 adjoins to the second metal layer 15, and a material of which the light blocking layer 11 is made is an oxide of a metal material of which the second metal layer 15 is made.

Figure 3A:
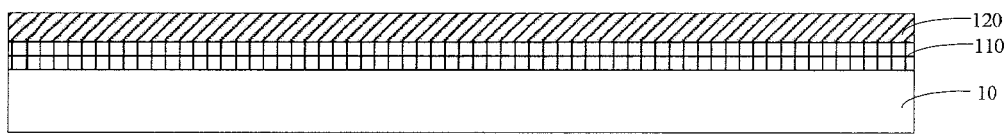
FIGS. 3a-3q are schematic sectional views showing structures formed in steps of a method of manufacturing a thin film transistor on a base substrate according to an embodiment of the present disclosure.
Figure 3B:
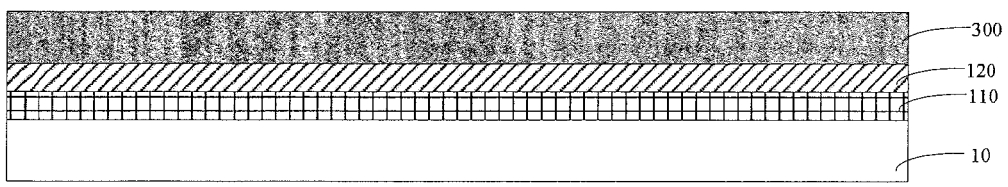
Figure 3C:
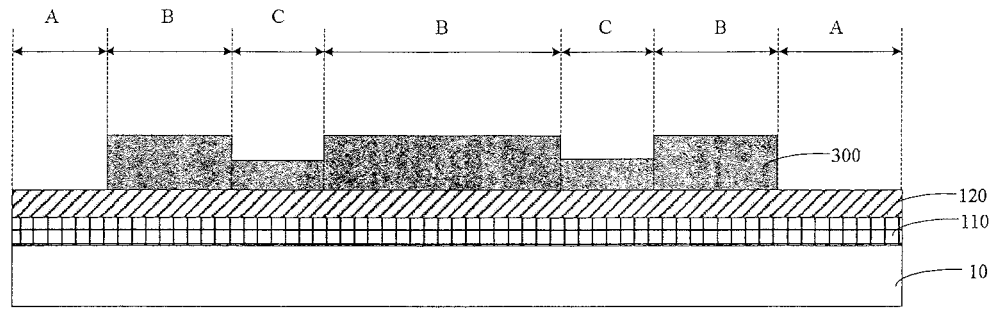
Figure 3D:
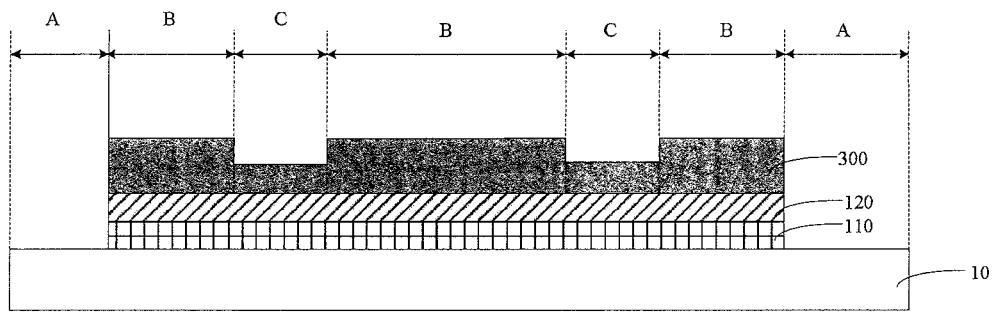
Figure 3E:
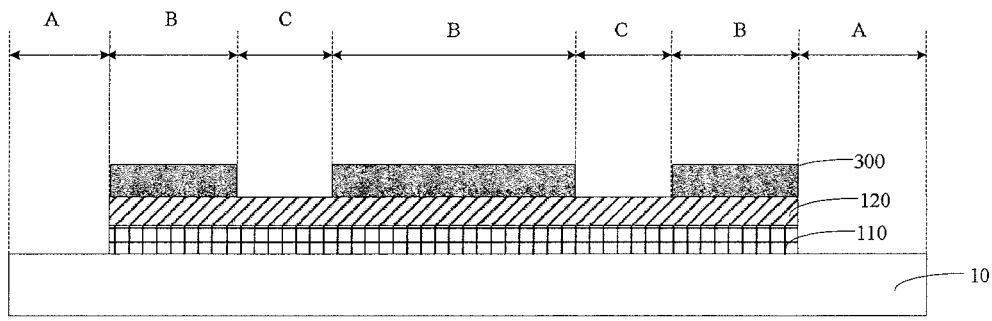
Figure 3F:
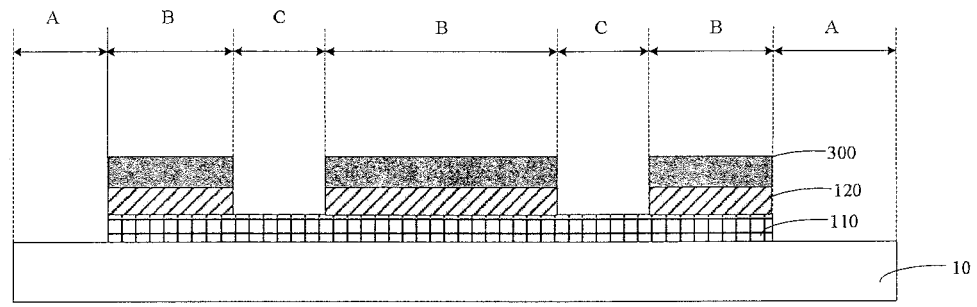
Figure 3G:
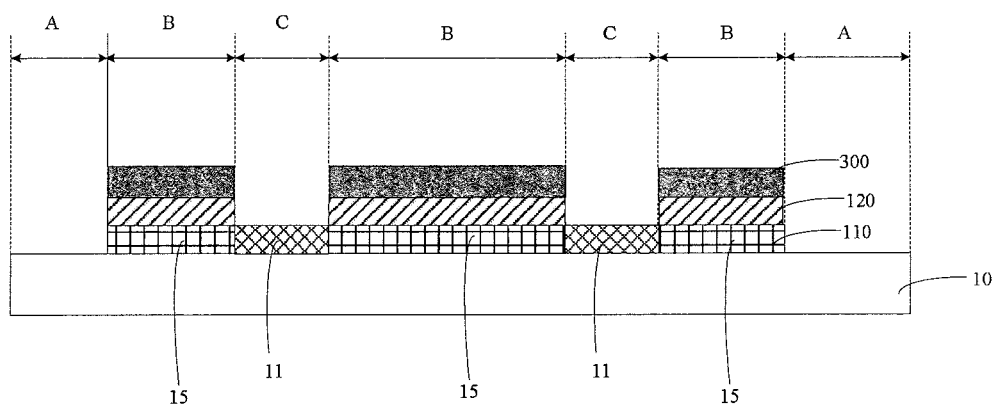
Figure 3H:
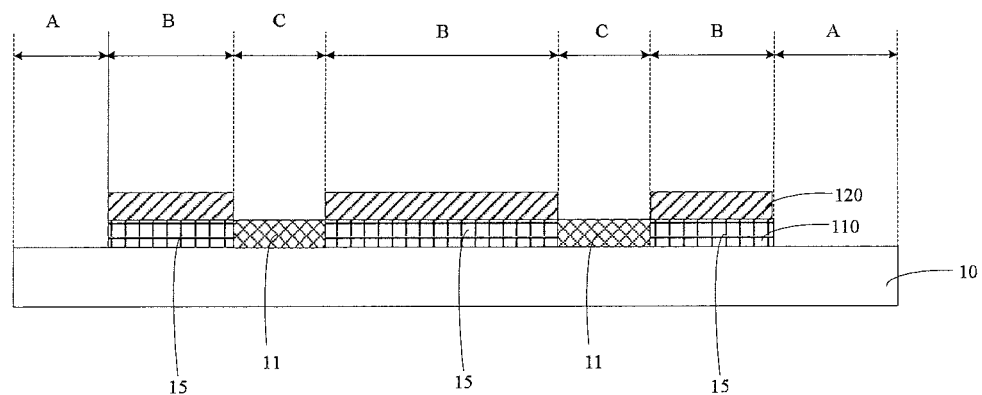
Figure 3I:
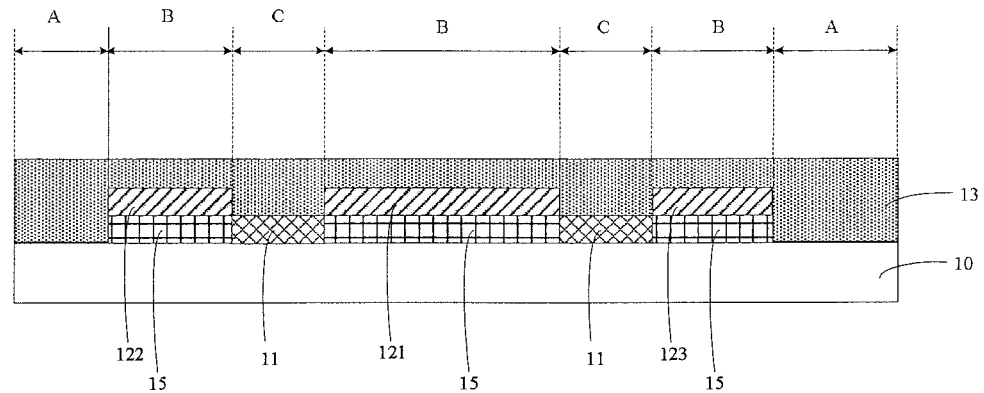
Figure 3J:
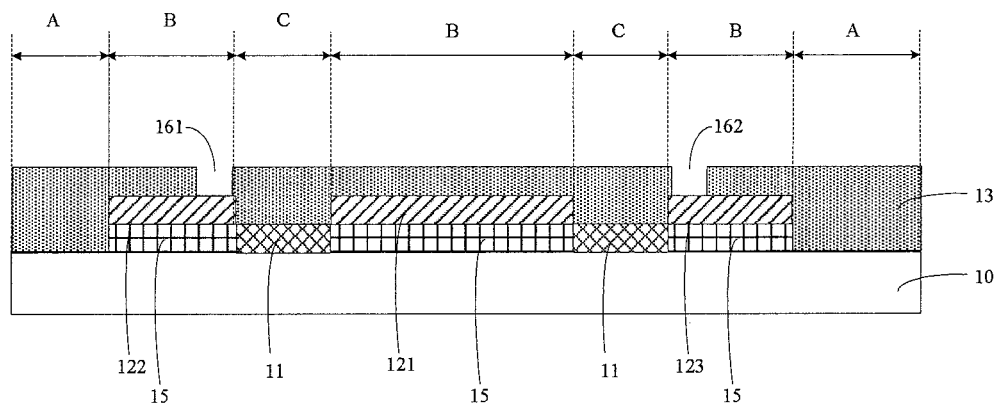
Figure 3K:
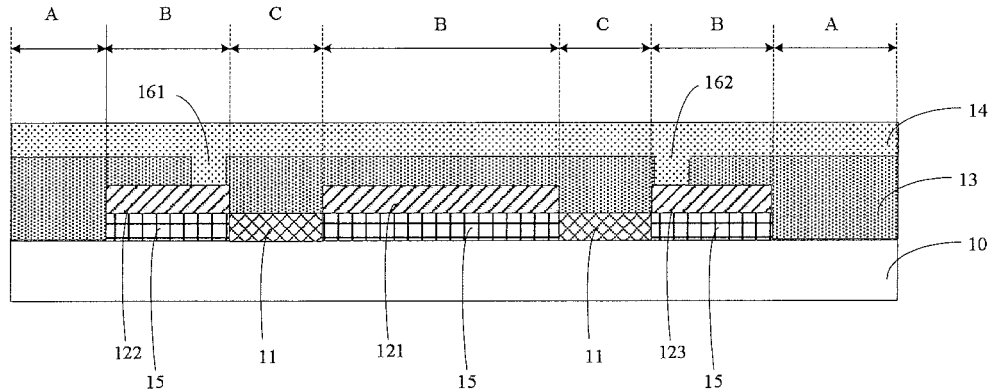
Figure 3L:
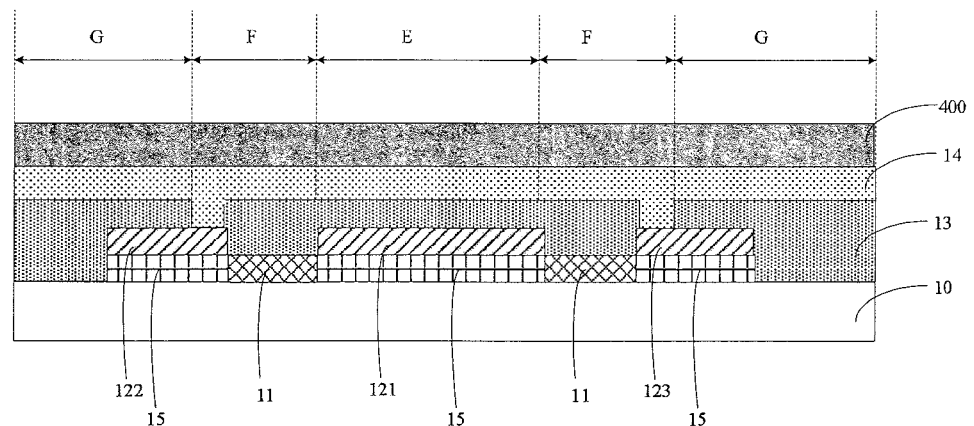
Figure 3M:
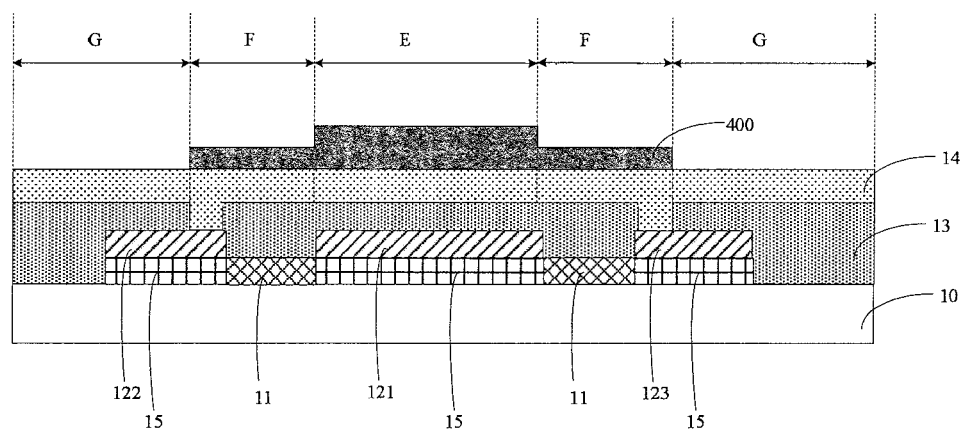
Figure 3N:
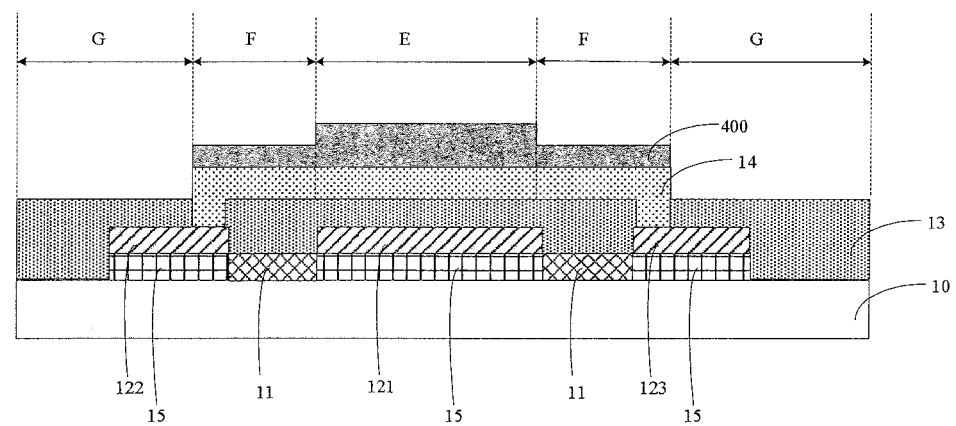
Figure 3O:
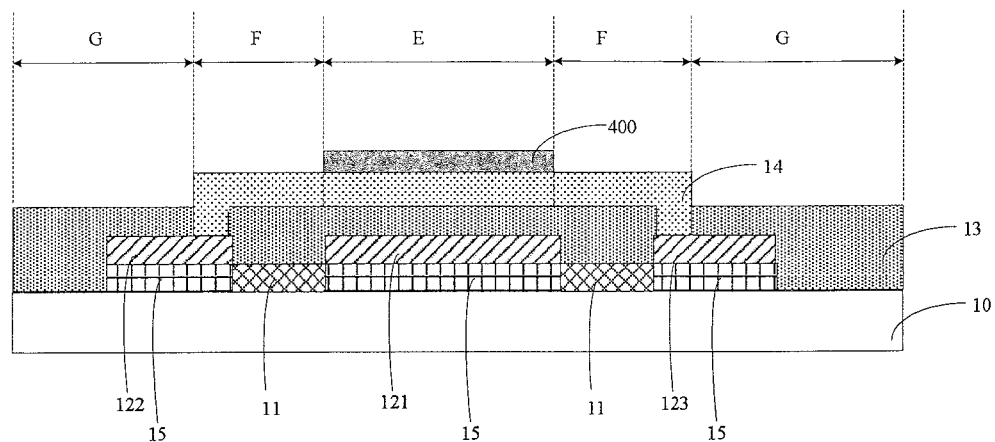
Figure 3P:
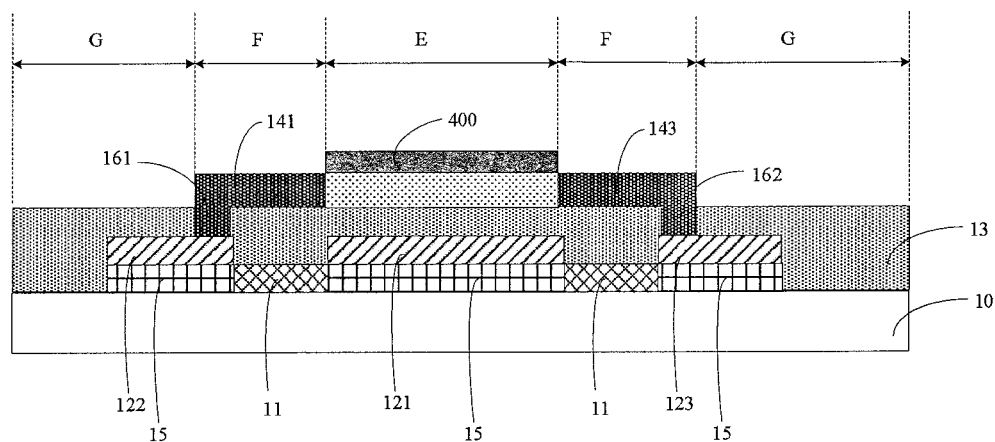
Figure 3Q:
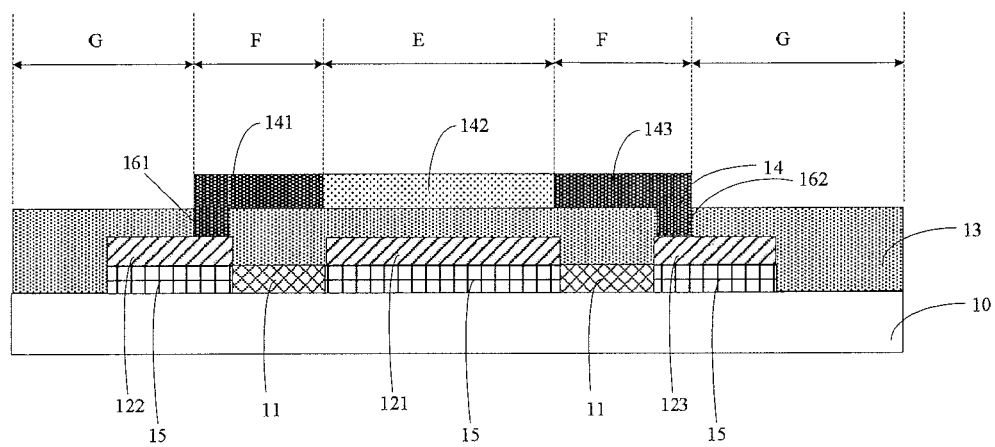
Figure 4:
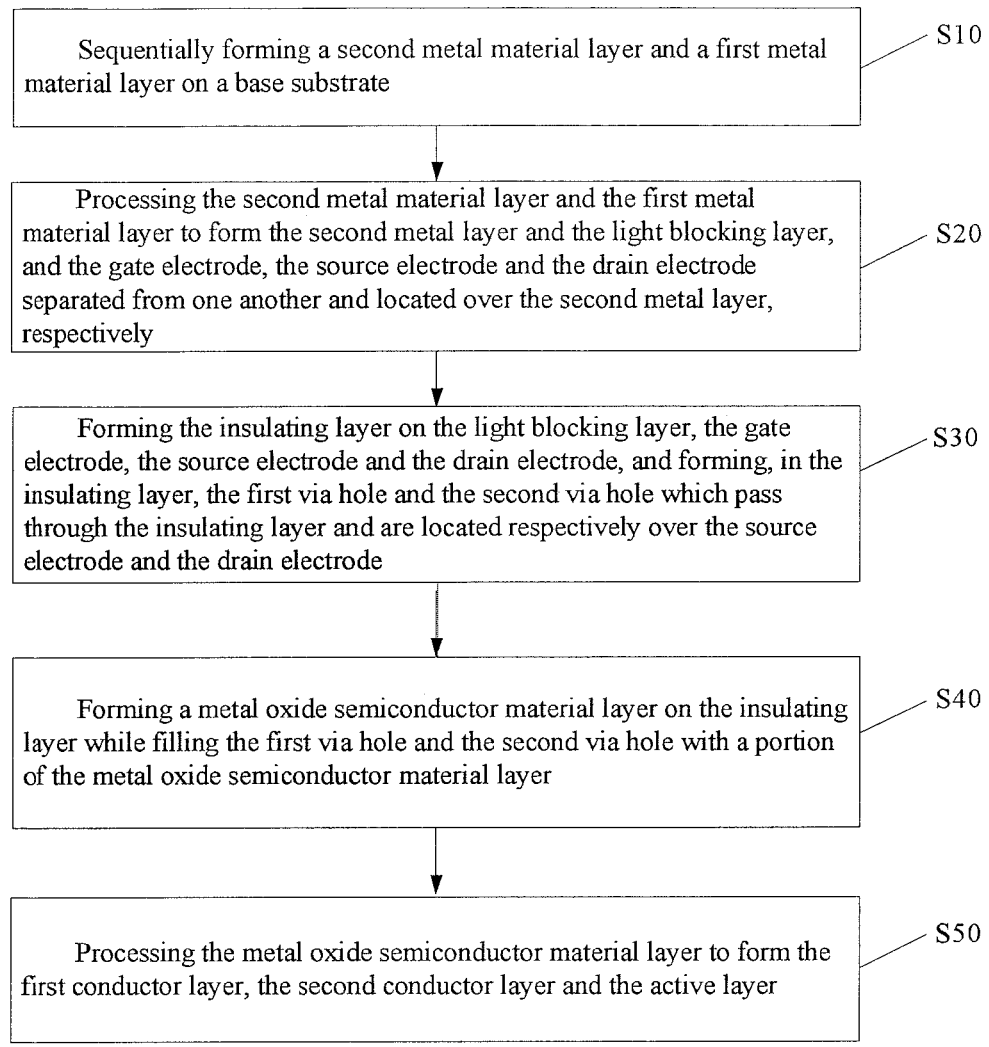
FIG. 4 is a schematic flow diagram of a method of manufacturing a thin film transistor according to an embodiment of the present disclosure.

FIGS. 3a-3q are schematic sectional views showing structures formed in steps for forming the thin film transistor on the base substrate 10. A method of manufacturing a thin film transistor, and the steps of sequentially forming the light blocking layer 11, the first metal layer, the insulating layer 13 and the combination layer, and forming the second metal layer 15 located in the same layer as the light blocking layer 11 in the above embodiments, are described in detail with reference to FIGS. 3a-3m and 4 as below. Referring to FIGS. 2, 3a-3q and 4, the method of manufacturing the thin film transistor according to some embodiments of the present disclosure includes:

a step S10 of sequentially forming a second metal material layer 110 and a first metal material layer 120 on a base substrate 10;

a step S20 of processing the second metal material layer 110 and the first metal material layer 120 to form the second metal layer 15 and the light blocking layer 11, and the gate electrode 121, the source electrode 122 and the drain electrode 123 which are separated from one another and located over the second metal layer 15, respectively;

a step S30 of forming the insulating layer 13 on the light blocking layer 11, the gate electrode 121, the source electrode 122 and the drain electrode 123, and forming, in the insulating layer 13, the first via hole 161 and the second via hole 162 which pass through the insulating layer 13 and are located respectively over the source electrode 122 and the drain electrode 123;

a step S40 of forming a metal oxide semiconductor material layer 14 on the insulating layer 13 while filling the first via hole 161 and the second via hole 162 with a portion of the metal oxide semiconductor material layer 14; and a step S50 of processing the metal oxide semiconductor material layer 14 to form the first conductor layer 141, the second conductor layer 143 and the active layer 142.

The above steps will now be specifically described with reference to FIGS. 2, 3a-3m and 4.

In the step S10, as shown in FIG. 3a, a second metal material layer 110 and a first metal material layer 120 are sequentially formed on a base substrate 10.

The second metal material layer 110 and the first metal material layer 120 may be sequentially deposited on the base substrate 10 by a chemical vapor deposition (CVD) process or a plasma enhanced chemical vapor deposition (PECVD) process.

A material of the second metal material layer 110 is a metal material, such as Cu, Ag, or Mn, which is capable of being oxidized to form a black light blocking layer, and the second metal material layer 110 has a thickness of for example 200Å-1500 Å.

A material of the first metal material layer 120 may be a common metal material for source and drain electrodes, for example a metal such as Cu, Ag, Mn, Al, Mo, Cr, Nd, Ni, Ta, and W, and an alloy of two or more of the above metals, and the first metal material layer 120 has a thickness of for example 1000Å-6000 Å.

In the step S20, the second metal material layer 110 and the first metal material layer 120 are processed to form the second metal layer 15 and the light blocking layer 11, and the gate electrode 121, the source electrode 122 and the drain electrode 123 which are separated from one another and located over the second metal layer 15, respectively.

Specifically, the step S20 may include the following steps S21, S22, S23, S24, S25, S26 and S27.

In the step S21, as shown in FIG. 3b, a first photoresist 300 is formed on the first metal material layer 120.

The first photoresist 300 having a certain thickness may be formed on the first metal material layer 120 by a coating process.

In the step S22, the first photoresist 300 is patterned by means of a half-tone mask process or a gray-tone mask process to form a photoresist-completely-retained region B corresponding to a segment of the first metal material layer 120 for forming the gate electrode 121, the source electrode 122 and the drain electrode 123, a photoresist-partially-retained region C corresponding to a segment of the second metal material layer 110 for forming the light blocking layer 11, and a photoresist-removed region A corresponding to other segments of the first metal material layer 120 and the second metal material layer 110.

The gray-tone mask process or the half-tone mask process is a process in which a photoresist is processed by means of a gray-tone mask or a half-tone mask. The gray-tone mask or the half-tone mask includes a light blocking region, and a light transmitting region including a completely transparent region and a partially transparent region which have different transmittances, for exposing the photoresist. The photoresist is exposed to form different photoresist regions, i.e., a photoresist-removed region, a photoresist-partially-retained region, and a photoresist-completely-retained region.

The gray-tone mask or the half-tone mask may specifically include a transparent quartz glass base substrate, and an opaque film and a translucent film disposed on the quartz glass base substrate. The opaque film is formed of an opaque light blocking material on the quartz glass base substrate to serve as the light blocking region. The translucent film is capable of partially or half transmitting a light. A region in which light blocking material films are arranged at intervals may be disposed on the quartz glass base substrate to form a region capable of partially or half transmitting the light as the partially transparent region. A region on the quartz glass base substrate where no opaque film or translucent film is formed serves as the completely transparent region.

In the case where the first photoresist is exposed by means of the gray-tone mask or the half-tone mask, a segment of the first photoresist corresponding to the light blocking region of the mask is not changed since the mask transmits no light in the light blocking region; a segment of the first photoresist corresponding to the completely transparent region of the mask having a greater transmittance is changed to be completely cured since it is irradiated by a light; and a segment of the first photoresist corresponding to the partially transparent region of the mask having a smaller transmittance is changed to be partially cured since a light which the partially transparent region transmits is not as sufficient as the light which the completely transparent region having the greater transmittance transmits.

Then, as shown in FIG. 3c, after the first photoresist 300 is developed by a developing solution, a segment of the first photoresist 300 corresponding to the light blocking region is removed since it is soluble in the developing solution, thereby forming the photoresist-removed region A; a segment of the first photoresist 300 corresponding to the completely transparent region is retained since it is completely insoluble in the developing solution, thereby forming the photoresist-completely-retained region B; and a segment of the first photoresist 300 corresponding to the partially transparent region is partially removed and partially retained since it is partially soluble in the developing solution, thereby forming the photoresist-partially-retained region C. In this case, the segment of the first photoresist 300 in the photoresist-partially-retained region C has a less thickness than the segment of the first photoresist 300 in the photoresist-completely-retained region B.

In the step S23, the other segments of the first metal material layer 120 and the second metal material layer 110 corresponding to the photoresist-removed region A are etched away.

As shown in FIG. 3c, the other segment of the first metal material layer 120 corresponding to the photoresist-removed region A is exposed. In this case, as shown in FIG. 3d, an etching may be performed by a dry etching process or a wet etching process. The other segment of the first metal material layer 120 corresponding to the photoresist-removed region A is first removed, and then, the etching is continued to remove the other segment of the second metal material layer 110 corresponding to the photoresist-removed region A, but the segments of the first metal material layer 120 and the second metal material layer 110 corresponding to the photoresist-partially-retained region C and the photoresist-completely-retained region B are retained.

In the step S24, the segment of the first photoresist in the photoresist-partially-retained region C, and a portion of a thickness of the segment of the first photoresist in the photoresist-completely-retained region B are removed.

As shown in FIG. 3e, the first photoresist 300 may be ashed by using an ashing process. The segment of the first photoresist 300 in the photoresist-partially-retained region C has a less thickness than the segment of the first photoresist 300 in the photoresist-completely-retained region B. Therefore, the segment of the first photoresist 300 in the photoresist-partially-retained region C is completely removed, and the segment of the first photoresist 300 in the photoresist-completely-retained region B is partially retained.

In the step S25, the segment of the first metal material layer 120 corresponding to the photoresist-partially-retained region C is etched away.

In the step S26, the exposed segment of the second metal material layer 110 corresponding to the photoresist-partially-retained region C is oxidized to form the light blocking layer 11. The segment of the second metal material layer 110 corresponding to the photoresist-completely-retained region B forms the second metal layer 15.

Since the segment of the first metal material layer 120 corresponding to the photoresist-partially-retained region C is exposed as shown in FIG. 3e, the segment of the first metal material layer 120 corresponding to the photoresist-partially-retained region C may be removed by the dry etching process or the wet etching process and the segment of the second metal material layer 110 corresponding to the photoresist-partially-retained region C is retained as shown in FIG. 3f.

As shown in FIG. 3g, the segment of the second metal material layer 110 corresponding to the photoresist-partially-retained region C is then oxidized to form the light blocking layer 11. For example, the material of which the second metal material layer 110 is made is Cu, Ag, Mn or the like which, by being oxidized, forms CuO, AgO, $MnO_2$ or the like as the light blocking layer.

All of the segments of the first metal material layer 120 and the second metal material layer 110 corresponding to the photoresist-completely-retained region B are retained, and the segment of the second metal material layer 110 corresponding to the photoresist-completely-retained region B is not oxidized to form the second metal layer 15.

In the step S27, the residual segment of the first photoresist 300 in the photoresist-completely-retained region B is removed. The segments of the first metal material layer 120 corresponding to the photoresist-completely-retained region B form the gate electrode 121, the source electrode 122 and the drain electrode 123, respectively.

As shown in FIG. 3h, the residual segment of the first photoresist 300 in the photoresist-completely-retained region B may be removed by using the ashing process again. The segments of the first metal material layer 120 corresponding to the photoresist-completely-retained region B form the gate electrode 121, the source electrode 122 and the drain electrode 123.

In the step S30, the insulating layer 13 is formed on the light blocking layer 11, the gate electrode 121, the source electrode 122 and the drain electrode 123, and the first via hole 161 and the second via hole 162 which pass through the insulating layer 13 and are located respectively over the source electrode 122 and the drain electrode 123 are formed in the insulating layer 13.

As shown in FIG. 3i, the insulating layer 13 having a certain thickness may be formed on the light blocking layer 11, the gate electrode 121, the source electrode 122 and the drain electrode 123 by a coating process. A material of the insulating layer 13 may be a common inorganic material such as silicon nitride for a gate insulating layer.

As shown in FIG. 3j, the insulating layer 13 is patterned to form the first via hole 161 and the second via hole 162 in the insulating layer 13. A specific patterning process may include steps of forming a photoresist layer by coating, exposing and developing the photoresist layer, etching the insulating layer, and the like. An existing process may be utilized and the specific patterning process is no longer described for the sake of brevity.

In the step S40, a metal oxide semiconductor material layer 14 is formed on the insulating layer 13 while the first via hole 161 and the second via hole 162 are filled with a portion of the metal oxide semiconductor material layer 14.

As shown in FIG. 3k, a metal oxide semiconductor material layer 14 having a certain thickness may be deposited on the insulating layer 13 by a method such as a chemical vapor deposition (CVD) or a plasma enhanced chemical vapor deposition (PECVD). Since the first via hole 161 and the second via hole 162 are formed in the insulating layer 13, the first via hole 161 and the second via hole 162 are also filled with a portion of the metal oxide semiconductor material layer 14.

In the step S50, the metal oxide semiconductor material layer 14 is processed to form the first conductor layer 141, the second conductor layer 143 and the active layer 142.

Specifically, the step S50 may include the following steps SM, S52, S53, S54, and S55.

In the step SM, as shown in FIG. 3l, a second photoresist 400 is formed on the metal oxide semiconductor material layer 14.

The second photoresist 400 having a certain thickness may be formed on the first metal material layer 14 by a coating process.

In the step S52, as shown in FIG. 3m, the second photoresist 400 is patterned by means of a half-tone mask process or a gray-tone mask process to form a photoresist-completely-retained region E corresponding to a segment of the metal oxide semiconductor material layer 14 for forming the active layer 142, a photoresist-partially-retained region F corresponding to a segment of the metal oxide semiconductor material layer 14 for forming the first conductor layer 141 and the second conductor layer 142, and a photoresist-removed region G corresponding to a to-be-removed segment of the metal oxide semiconductor material layer 14. The first via hole 161 is located in a region of the first conductor layer 141 and the second via hole 162 is located in a region of the second conductor layer 142.

A specific process of the step S52 is similar to that of the step S22 and is no longer described herein for the sake of brevity.

In the step S53, the to-be-removed segment of the metal oxide semiconductor material layer 14 corresponding to the photoresist-removed region G is etched away.

As shown in FIG. 3m, the to-be-removed segment of the metal oxide semiconductor material layer 14 corresponding to the photoresist-removed region G is exposed. As shown in FIG. 3n, an etching may be performed by a dry etching process or a wet etching process. The another exposed segment of the metal oxide semiconductor material layer 14 corresponding to the photoresist-removed region G is removed, but the segments of the metal oxide semiconductor material layer 14 corresponding to the photoresist-partially-retained region F and the photoresist-completely-retained region E are retained.

In the step S54, the segment of the second photoresist 400 in the photoresist-partially-retained region F, and a portion of a thickness of the segment of the second photoresist 400 in the photoresist-completely-retained region E are removed.

As shown in FIG. 3o, the second photoresist 400 may be ashed by using an ashing process. The segment of the second photoresist 400 in the photoresist-partially-retained region F has a less thickness than the segment of the second photoresist 400 in the photoresist-completely-retained region E. Therefore, the segment of the second photoresist 400 in the photoresist-partially-retained region F is completely removed, and the segment of the second photoresist 400 in the photoresist-completely-retained region E is partially retained.

In the step S55, the segment of the metal oxide semiconductor material layer 14 corresponding to the photoresist-partially-retained region F is metalized so that the segment of the metal oxide semiconductor material layer 14 corresponding to the photoresist-partially-retained region F is conductorized to form the first conductor layer 141 and the second conductor layer 143, while the portion of the metal oxide semiconductor material layer 14 in the first via hole 161 and the second via hole 162 is conductorized.

As shown in FIG. 3o, the segment of the metal oxide semiconductor material layer 14 corresponding to the photoresist-partially-retained region F is exposed. As shown in FIG. 3p, the exposed segment of the metal oxide semiconductor material layer 14 may be metalized by using a helium gas, a hydrogen gas or the like to remove oxygen from the exposed segment of the metal oxide semiconductor material layer 14. Thereby, the segment of the metal oxide semiconductor material layer 14 corresponding to the photoresist-partially-retained region F is conductorized. The segment of the metal oxide semiconductor material layer 14 is in a region corresponding to the first conductor layer 141 and the second conductor layer 143 and thus forms the first conductor layer 141 and the second conductor layer 143. The first via hole 161 is in a region where the first conductor layer 141 is located, and the second via hole 162 is in a region where the second conductor layer 143 is located. Therefore, the portion of the metal oxide semiconductor material layer 14 filled in the first via hole 161 and the second via hole 162 is also conductorized. In this way, the first conductor layer 141 is electrically connected to the source electrode 122 through a portion of the conductor layer located in the first via hole 161, and the second conductor layer 143 is electrically connected to the drain electrode 123 through a portion of the conductor layer located in the second via hole 162.

In the step S27, the residual segment of the second photoresist in the photoresist-completely-retained region E is removed. The segment of the metal oxide semiconductor material layer 14 corresponding to the photoresist-completely-retained region E forms the active layer 142.

As shown in FIG. 3q, the segment of the metal oxide semiconductor material layer 14 corresponding to the photoresist-completely-retained region E is not changed in property and thus is not conductorized since it is shielded by the segment of the second photoresist 400. After the residual segment of the second photoresist 400 in the photoresist-completely-retained region E is removed by an ashing process, the segment of the metal oxide semiconductor material layer 14 corresponding to the photoresist-completely-retained region E forms the active layer 142.

Figure 1:
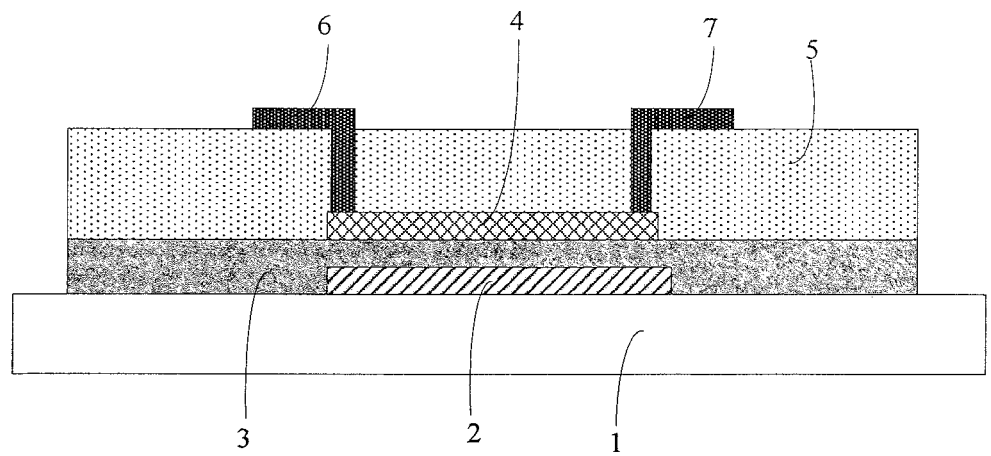
FIG. 1 is a schematic sectional view showing a structure of a conventional array substrate.

As can be known from the foregoing, in the method of manufacturing the thin film transistor, only three patterning processes are needed to form structures in layers of the thin film transistor. The three patterning processes are a first patterning process for forming the gate electrode, the source electrode and the drain electrode, a second patterning process for forming the first via hole and the second via hole, and a third patterning process for forming the first conductor layer, the second conductor layer and the active layer, respectively. Therefore, at least one patterning process is saved compared with an existing method of manufacturing a thin film transistor. For example, four patterning processes are needed in the existing method of manufacturing the thin film transistor shown in FIG. 1. The four patterning processes are a first patterning process for forming the gate electrode, a second patterning process for forming the active layer, a third patterning process for forming the via hole in the interlayer insulating layer, and a fourth patterning process for forming the source electrode and the drain electrode, respectively. Therefore, the method according the embodiments of the present disclosure is simple, low in cost, and favorable to an improvement of a yield of the thin film transistor.

In the method, the gate electrode, the source electrode and the drain electrode are simultaneously formed by a single patterning process, thereby saving one patterning process compared with the existing method in which the gate electrode, the source electrode and the drain electrode are formed by two patterning processes, i.e., one patterning process for forming the gate electrode, and the other patterning process for forming the source electrode and the drain electrode.

It should be noted that the terms "over" and "under" used herein are for the order of forming layers. One layer being under the other layer means that the other layer is formed after the one layer is formed. Similarly, one layer being over the other layer means that the one layer is formed after the other layer is formed. Of course, the two layers may be in direct contact with each other, or an additional layer may be included between the two layers. There is no particular limitation in the embodiments of the present disclosure.

Embodiments of the present disclosure further provide a display panel including the array substrate according to any one of the abovementioned embodiments.

With the thin film transistor according to the embodiments of the present disclosure, the light blocking layer is disposed, thereby avoiding an adverse influence of a light irradiation on the thin film transistor and thus improving an operational stability of the thin film transistor.

The display panel includes the array substrate according to any one of the above embodiments. The display panel may be applied in any products or parts having display function such as an electronic paper, a mobile phone, a tablet computer, a TV, a display, a notebook computer, a digital frame, a navigator, and a wearable apparatus.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. A thin film transistor comprising:
   a light blocking layer, an electrode layer, and a combination layer, which are sequentially stacked in a stacking direction;
   wherein the electrode layer comprises a gate electrode, a source electrode and a drain electrode which are separated from one another, and the gate electrode is located between the source electrode and the drain electrode,
   wherein the light blocking layer comprises: a first portion of which an orthogonal projection in the stacking direction is located between an orthogonal projection of the gate electrode in the stacking direction and an orthogonal projection of the source electrode in the stacking direction; and a second portion of which an orthogonal projection in the stacking direction is located between the orthogonal projection of the gate electrode in the stacking direction and an orthogonal projection of the drain electrode in the stacking direction; and
   wherein the combination layer comprises an active layer, the thin film transistor further comprising:
   a metal layer located in a same layer as the light blocking layer, wherein the metal layer comprises a first portion, a second portion and a third portion respectively located under the gate electrode, the source electrode and the drain electrode,
   wherein the light blocking layer adjoins to the metal layer, and a material of which the light blocking layer is made is an oxide of a metal material of which the metal layer is made.

2. The thin film transistor as claimed in claim 1, wherein:
   an orthogonal projection of the active layer in the stacking direction is in a range of the orthogonal projection of the gate electrode in the stacking direction.

3. The thin film transistor as claimed in claim 1, further comprising:
   an insulating layer having a portion located between the electrode layer and the combination layer,
   wherein the combination layer further comprises a first conductor layer and a second conductor layer respectively located on two sides of the active layer, the first conductor layer is electrically connected to the source electrode through a first via hole passing through the insulating layer, and the second conductor layer is electrically connected to the drain electrode through a second via hole passing through the insulating layer.

4. The thin film transistor as claimed in claim 3, wherein:
a material of which the active layer is made is a metal oxide semiconductor material, and the first conductor layer and the second conductor layer are formed by conductorizing the metal oxide semiconductor material.

5. The thin film transistor as claimed in claim 1, wherein:
the electrode layer comprises another metal layer.

6. The thin film transistor as claimed in claim 1, wherein:
the orthogonal projections of the gate electrode, the source electrode and the drain electrode in the stacking direction coincide with orthogonal projections of the first portion, the second portion and the third portion of the metal layer in the stacking direction, respectively.

7. An array substrate comprising:
a base substrate; and
the thin film transistor as claimed in claim 1, formed on the base substrate.

8. A display panel comprising:
the array substrate as claimed in claim 7.

9. A method of manufacturing a thin film transistor, the method comprising:
sequentially forming a light blocking layer, an electrode layer, and a combination layer in a stacking direction;
wherein the electrode layer comprises a gate electrode, a source electrode and a drain electrode which are separated from one another, and the gate electrode is located between the source electrode and the drain electrode,
wherein the light blocking layer comprises: a first portion of which an orthogonal projection in the stacking direction is located between an orthogonal projection of the gate electrode in the stacking direction and an orthogonal projection of the source electrode in the stacking direction; and a second portion of which an orthogonal projection in the stacking direction is located between the orthogonal projection of the gate electrode in the stacking direction and an orthogonal projection of the drain electrode in the stacking direction; and
wherein the combination layer comprises an active layer, the method further comprising:
forming an insulating layer subsequent to forming the electrode layer and prior to forming the combination layer,
wherein the combination layer further comprises a first conductor layer and a second conductor layer respectively located on two sides of the active layer, the first conductor layer is electrically connected to the source electrode through a first via hole passing through the insulating layer, and the second conductor layer is electrically connected to the drain electrode through a second via hole passing through the insulating layer,
the method further comprising:
forming a metal layer located in a same layer as the light blocking layer, wherein the metal layer comprises a first portion, a second portion and a third portion respectively located under the gate electrode, the source electrode and the drain electrode,
wherein the light blocking layer adjoins the metal layer, and a material of which the light blocking layer is made is an oxide of a metal material of which the metal layer is made.

10. The method as claimed in claim 9, wherein:
an orthogonal projection of the active layer in the stacking direction is in a range of the orthogonal projection of the gate in the stacking direction.

11. The method as claimed in claim 9, wherein:
the electrode layer comprises another metal layer.

12. The method as claimed in claim 9, wherein
the step of sequentially forming the light blocking layer, the electrode layer, and the combination layer; the step of forming the insulating layer; and the step of forming the metal layer, comprise:
sequentially forming a second metal material layer and a first metal material layer;
processing the second metal material layer and the first metal material layer to form the metal layer and the light blocking layer, and the gate electrode, the source electrode and the drain electrode that are separated from one another and located over the metal layer, respectively;
forming the insulating layer on the light blocking layer, the gate electrode, the source electrode and the drain electrode, and forming, in the insulating layer, the first via hole and the second via hole which pass through the insulating layer and are located respectively over the source electrode and the drain electrode;
forming a metal oxide semiconductor material layer on the insulating layer while filling the first via hole and the second via hole with a portion of the metal oxide semiconductor material layer; and
processing the metal oxide semiconductor material layer to form the first conductor layer, the second conductor layer and the active layer while the portion of the metal oxide semiconductor material layer in the first via hole and the second via hole is conductorized.

13. The method as claimed in claim 12, wherein
processing the second metal material layer and the first metal material layer to form the metal layer and the light blocking layer, and the gate electrode, the source electrode and the drain electrode that are separated from one another and located over the metal layer, respectively comprises:
forming a first photoresist on the first metal material layer;
patterning the first photoresist by means of a half-tone mask process or a gray-tone mask process to form a photoresist-completely-retained region corresponding to a segment of the first metal material layer for forming the gate electrode, the source electrode and the drain electrode, a photoresist-partially-retained region corresponding to a segment of the second metal material layer for forming the light blocking layer, and a photoresist-removed region corresponding to other segments of the first metal material layer and the second metal material layer;
etching away the other segments of the first metal material layer and the second metal material layer corresponding to the photoresist-removed region;
removing a segment of the first photoresist in the photoresist-partially-retained region, and a portion of a thickness of a segment of the first photoresist in the photoresist-completely-retained region;
etching away a segment of the first metal material layer corresponding to the photoresist-partially-retained region; and
oxidizing the exposed segment of the second metal material layer corresponding to the photoresist-partially-retained region to form the light blocking layer, wherein a segment of the second metal material layer corresponding to the photoresist-completely-retained region forms the metal layer.

14. The method as claimed in claim 13, wherein processing the second metal material layer and the first metal material layer to form the metal layer and the light blocking layer, and the gate electrode, the source electrode and the drain electrode that are separated from one another and located over the metal layer, respectively further comprises:
removing the residual segment of the first photoresist in the photoresist-completely-retained region, wherein a segment of the first metal material layer corresponding to the photoresist-completely-retained region forms the gate electrode, the source electrode and the drain electrode.

15. The method as claimed in claim 12, wherein processing the metal oxide semiconductor material layer comprising:
forming a second photoresist on the metal oxide semiconductor material layer;
patterning the second photoresist by means of a half-tone mask process or a gray-tone mask process to form a photoresist-completely-retained region corresponding to a segment of the metal oxide semiconductor material layer for forming the active layer, a photoresist-partially-retained region corresponding to a segment of the metal oxide semiconductor material layer for forming the first conductor layer and the second conductor layer, and a photoresist-removed region corresponding to a to-be-removed segment of the metal oxide semiconductor material layer, wherein the first via hole is located in a region of the first conductor layer and the second via hole is located in a region of the second conductor layer;
etching away the to-be-removed segment of the metal oxide semiconductor material layer corresponding to the photoresist-removed region;
removing a segment of the second photoresist in the photoresist-partially-retained region, and a portion of a thickness of a segment of the second photoresist in the photoresist-completely-retained region; and
metalizing the segment of the metal oxide semiconductor material layer corresponding to the photoresist-partially-retained region so that the segment of the metal oxide semiconductor material layer corresponding to the photoresist-partially-retained region is conductorized to form the first conductor layer and the second conductor layer, while the portion of the metal oxide semiconductor material layer in the first via hole and the second via hole is conductorized.

16. The method as claimed in claim 15, wherein processing the metal oxide semiconductor material layer further comprising:
removing the residual segment of the second photoresist in the photoresist-completely-retained region, wherein a segment of the metal oxide semiconductor material layer corresponding to the photoresist-completely-retained region forms the active layer.

17. A method of manufacturing a thin film transistor, the method comprising:
sequentially forming a tight blocking layer, an electrode layer, and a combination layer in a stacking direction;
wherein the electrode layer comprises a gate electrode, a source electrode and a drain electrode which are separated from one another, and the gate electrode is located between the source electrode and the drain electrode,
wherein the light blocking layer comprises: a first portion of which an orthogonal projection in the stacking direction is located between an orthogonal projection of the gate electrode in the stacking direction and an orthogonal projection of the source electrode in the stacking direction; and a second portion of which an orthogonal projection in the stacking direction is located between the orthogonal projection of the gate electrode in the stacking direction and an orthogonal projection of the drain electrode in the stacking direction; and
wherein the combination layer comprises an active layer, the method further comprising:
forming an insulating layer subsequent to forming the electrode layer and prior to forming the combination layer,
wherein the combination layer further comprises a first conductor layer and a second conductor layer respectively located on two sides of the active layer, the first conductor layer is electrically connected to the source electrode through a first via hole passing through the insulating layer, and the second conductor layer is electrically connected to the drain electrode through a second via hole passing through the insulating layer, and
wherein a material of which the active layer is made is a metal oxide semiconductor material, and the first conductor layer and the second conductor layer are formed by conductorizing the metal oxide semiconductor material.

* * * * *